United States Patent
Ko et al.

(10) Patent No.: US 8,729,935 B2
(45) Date of Patent: May 20, 2014

(54) START-UP CIRCUIT FOR AN OUTPUT DRIVER

(71) Applicant: Taiwan Semiconductor Manufacturing Company Limited, Hsin-Chu (TW)

(72) Inventors: Cheng-Ting Ko, Hsinchu (TW); Tsung-Hsin Yu, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/629,703

(22) Filed: Sep. 28, 2012

(65) Prior Publication Data
US 2014/0091837 A1    Apr. 3, 2014

(51) Int. Cl.
*H03L 7/00* (2006.01)
(52) U.S. Cl.
USPC ............................ 327/142; 327/143; 327/198
(58) Field of Classification Search
USPC .......................................... 327/142, 143, 198
See application file for complete search history.

(56) References Cited

U.S. PATENT DOCUMENTS

2007/0085573 A1 *   4/2007   Henzler et al. ................. 327/100

* cited by examiner

*Primary Examiner* — John Poos
(74) *Attorney, Agent, or Firm* — Cooper Legal Group LLC

(57) ABSTRACT

One or more techniques and systems for starting an output driver and an associated start-up circuit are provided herein. In some embodiments, a voltage provider is configured to charge a charge store to a pre-turn-on voltage. In some embodiments, an output driver is configured to control a connection between the charge store and the output driver. For example, the connection enables the charge store to discharge a voltage to the output driver, thus starting the output driver. Accordingly, a response time associated with starting the output driver is mitigated at least because the charge store is charged to the pre-turn-on voltage and connected to the output driver such that a gate of the driver is biased in a sudden fashion. In this manner, the driver is turned on more quickly. Additionally, effects associated with process, voltage, and temperature variations are mitigated, for example.

20 Claims, 10 Drawing Sheets

START-UP CIRCUIT FOR AN OUTPUT DRIVER

BACKGROUND

Generally, an output driver comprises a metal oxide semiconductor (MOS) transistor and is associated with a delayed response time when the MOS transistor or MOS driver is turned on. For example, the MOS transistor is delayed at least due to a variation in at least one of process, voltage, or temperature (PVT) associated with the output driver. Additionally, the MOS transistor is delayed at least because a gate of the MOS transistor or MOS driver requires time to pull the gate of the MOS to a turn-on voltage. In some scenarios the delay results in a disproportionate rise fall ratio for the output driver. For example, if the delay is associated with a pull down transistor, such as the MOS transistor connected to a pad, a rising time is less than a falling time for the output driver, thus leading to the disproportionate rise fall ratio.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques and systems for starting an output driver and an associated start-up circuit for operating the output driver are provided herein. In some embodiments, a voltage provider charges a charge store to a pre-turn-on voltage. The charge store is connected to an output driver such that a metal oxide semiconductor (MOS) transistor or a MOS driver of the output driver receives the charge of the charge store at the pre-turn-on voltage. In some embodiments, the MOS driver is configured to control a voltage of a pad based on the connection from the charge store to the output driver.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
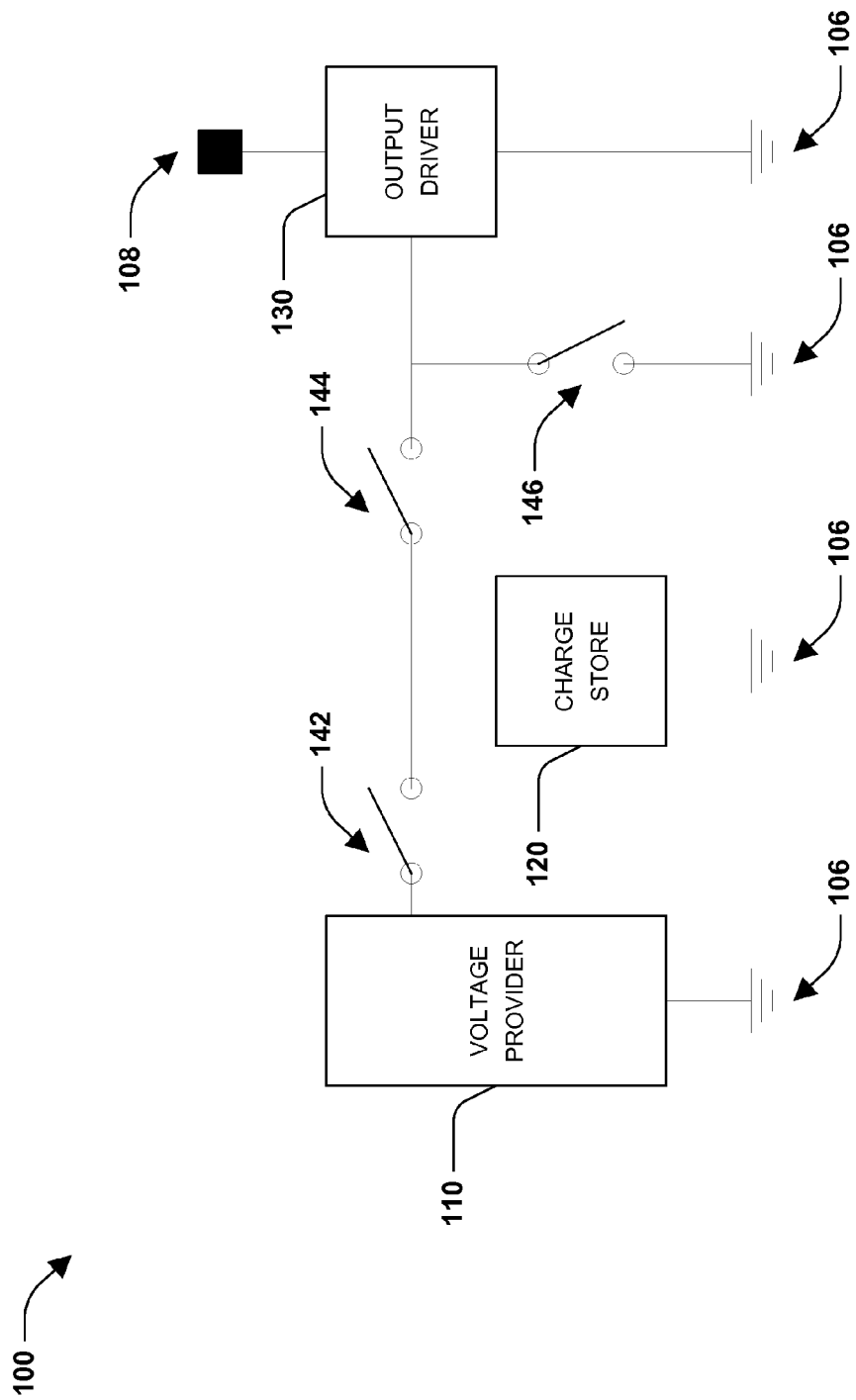
FIG. 1 is a schematic diagram of an example start-up circuit for operating an output driver, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

FIG. 1 is a schematic diagram of an example start-up circuit 100 for operating an output driver, according to some embodiments. For example, the start-up circuit 100 comprises a voltage provider 110, a charge store 120, an output driver 130, and pad 108. In some embodiments, the start-up circuit 100 comprises a first control switch 144, a second control switch 142, and a third control switch 146. In some embodiments, the voltage provider 110 is connected to ground 106 and the second control switch 142. Additionally, the charge store 120 is connected to ground 106, the first control switch 144, and the second control switch 142. In some embodiments, the output driver 130 is connected to ground 106, pad 108, the first control switch 144, and the third control switch 146.

In some embodiments, the second control switch 142 is configured to control a second connection between the voltage provider 110 and the charge store 120. That is, the second control switch 142 connects or disconnects the voltage provider 110 from the charge store 120 when closed or opened, respectively. In some embodiments, the voltage provider 110 is configured to charge the charge store 120 to a pre-turn-on voltage when the second control switch 142 is closed. Additionally, it will be appreciated that the second control switch 142 and the third control switch 146 are configured to open when the first control switch 144 is closed and vice versa, in some embodiments. Therefore, when the voltage provider 110 is connected to the charge store 120 via the second control switch 142, the output driver 130 is not connected to the charge store 120 at least because the first control switch 144 is open. Accordingly, the first control switch 144 is configured to control a first connection between the charge store 120 and the output driver 130. That is, the first control switch 144 connects or disconnects the charge store 120 from the output driver 130. For example, when the first control switch 144 is open, the charge store 120 is disconnected from the output driver 130. In another example, when the first control switch 144 is closed, the charge store 120 is connected to the output driver 130. In some embodiments, the first control switch 144 is configured to enable charge sharing between the charge store 120 and the output driver 130. For example, when charge sharing is enabled, such as when the first control switch 144 is closed, a discharged voltage is provided to the output driver 130 from the charge store 120. It will be appreciated that the charge store 120 is charged to a pre-turn-on voltage different than the discharged voltage in some embodiments. In some embodiments, the charge store 120 is a structure configured to store a charge, such as a capacitor, for example. In other embodiments, the charge store 120 is a circuit configured to store a charge, such as an electrostatic discharge (ESD) circuit, for example. In some embodiments, the charge store 120 is a parasitic capacitance.

In some embodiments, the voltage provider 110 is configured to charge the charge store 120 to a pre-turn-on voltage via the second control switch 142 at a first time. Additionally, at the first time, the first control switch 144 is open and the third control switch 146 is closed such that the voltage provider 110 and the charge store 120 forms a first circuit and the output driver forms a second circuit not connected to the first circuit. Accordingly, after the first time has passed, the charge store 120 is charged to the pre-turn-on voltage by the voltage provider 110. At a second time, the second control switch 142 and the third control switch 146 are opened, and the first control switch 144 is closed. Therefore, the voltage provider 110 forms a third circuit, and the charge store 120 and the output driver 130 forms a fourth circuit not connected to the third circuit. At the second time, the first control switch 144 connects the charge store 120 to the output driver 130 and enables the charge store 120 to provide the pre-turn-on voltage to the output driver 130. For example, the charge store 120 is configured to discharge a stored voltage of the charge store 120, such as the pre-turn-on voltage, to the output driver 130 via the first control switch 144. For example, the charge store 120 is configured to discharge a stored charge to the output driver 130 through the first control switch 144, thus applying the stored charge to the output driver 130. Accordingly, a voltage level of the output driver 130 will rise to a pre-turn-on voltage. In this way, the output driver 130 is activated such that a response time between the discharge of the charge store 120 and activation of the output driver 130 is mitigated. Additionally, there is substantially no start-up current associated with discharging the charge store 120 to the output driver 130, thus mitigating process, voltage, or temperature (PVT) variations associated with starting the output driver 130. In addition to mitigating a delay associated with a response time for the output driver 130, a rise fall ratio is controlled at least because a smaller delay generally results in tighter falling times for a voltage level associated with a pad of the output driver 130, for example.

In some embodiments, the third control switch 146 is configured to control a third connection between a portion of the output driver 130 and ground 106. That is, the third control switch 146 connects or disconnects the portion of the output driver 130 to ground 106. In some embodiments, the third control switch 146 is configured to control the third connection between a third gate of a third MOS transistor of the output driver 130 and ground 106. Additionally, the third control switch 146 is connected to the first control switch 144. In some embodiments, the third control switch 146 is configured to control the third connection based on logic of the second control switch 142.

Figure 2:
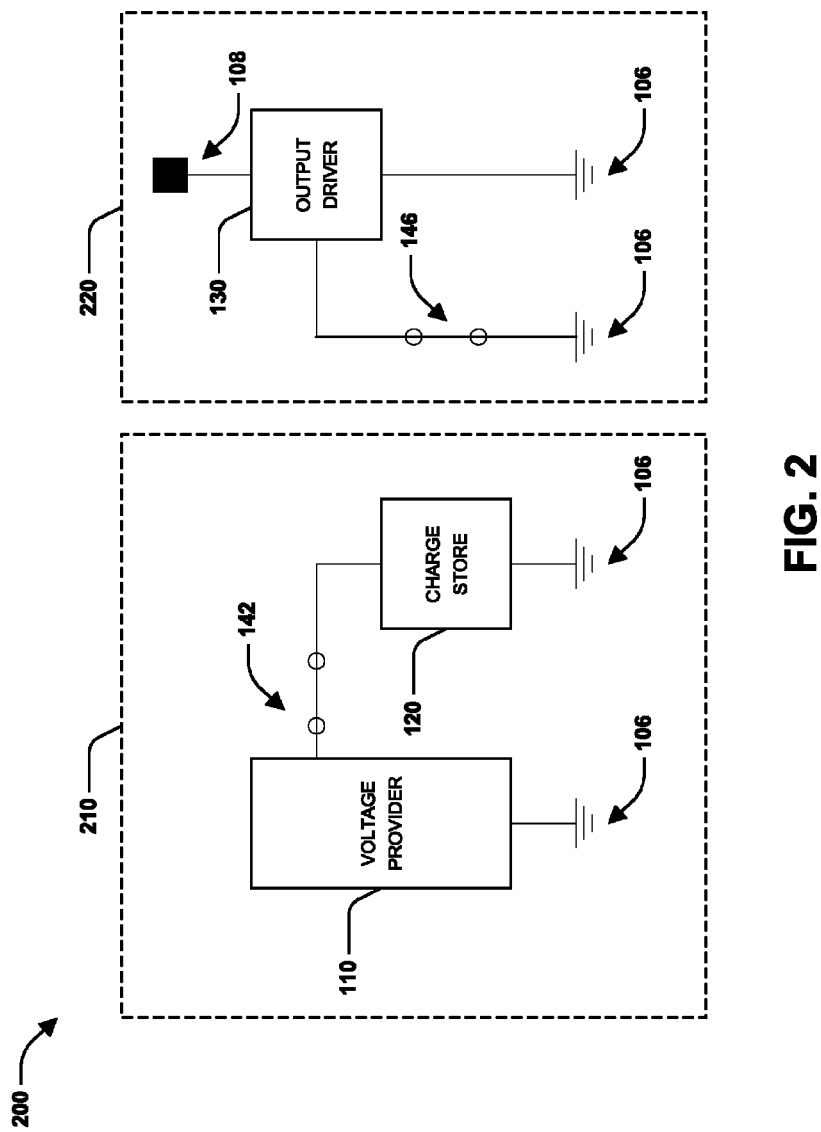
FIG. 2 is a schematic diagram of an example start-up circuit for operating an output driver, according to some embodiments.

FIG. 2 is a schematic diagram of an example start-up circuit 200 for operating an output driver, according to some embodiments. It will be appreciated that in some embodiments, the start-up circuit 200 of FIG. 2 is the start-up circuit 100 of FIG. 1 where the first control switch 144 is open, the second control switch 142 is closed, and the third control switch 146 is closed. In some embodiments, the first control switch 144 is opened, the second control switch 142 is closed, and the third control switch 146 is closed at a first time, for example. In this way, a first circuit 210 and a second circuit 220 are formed, for example. In some embodiments, the first circuit 210 comprises the voltage provider 110 and the charge store 120. For example, the voltage provider is connected to the charge store 120 via a second connection formed by the second control switch 142. Additionally, the voltage provider 110 is connected to ground 106. The charge store 120 is connected to ground 106. The first circuit 210 is thus configured to charge the charge store 120 based on the voltage provider 110 and the second control switch 142. In some embodiments, the voltage provider 110 is configured to charge the charge store 120 to a pre-turn-on voltage. The second circuit 220 is configured to connect a portion of the output driver 130 to ground 106 via a third control switch 146. It will be appreciated that the third control switch 146 is closed at the first time. Additionally, the output driver 130 is connected to pad 108 and ground 106. In some embodiments, the output driver 130 waits for the charge store 120 to reach the pre-turn-on voltage during the first time.

Figure 3:
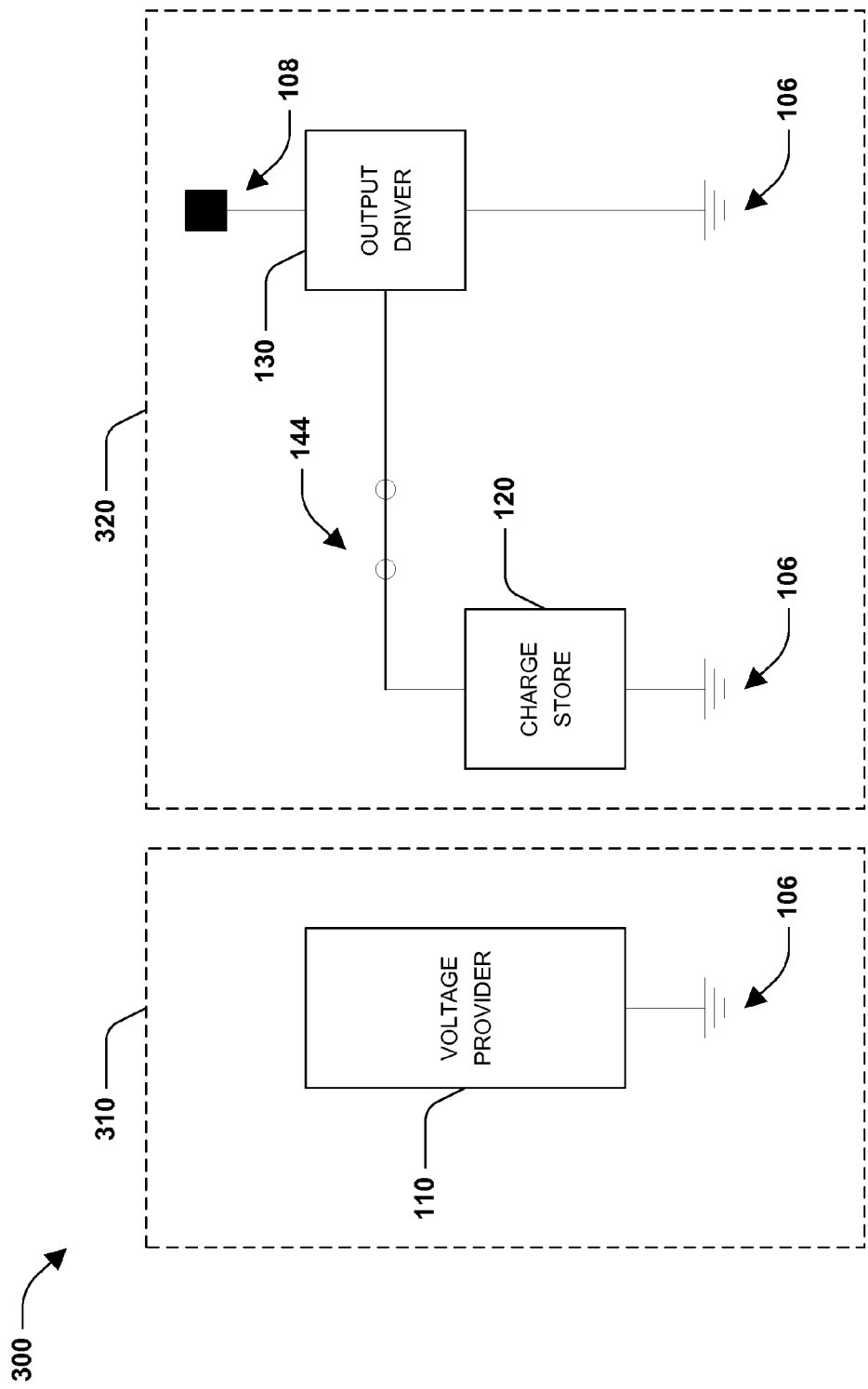
FIG. 3 is a schematic diagram of an example start-up circuit for operating an output driver, according to some embodiments.

FIG. 3 is a schematic diagram of an example start-up circuit 300 for operating an output driver, according to some embodiments. It will be appreciated that in some embodiments, the start-up circuit 300 of FIG. 3 is the start-up circuit 100 of FIG. 1 where the first control switch 144 is closed, the second control switch 142 is open, and the third control switch 146 is open. In some embodiments, the first control switch 144 is closed, the second control switch 142 is opened, and the third control switch 146 is opened at a second time. In some examples, the second time is at a time after the first time associated with the start-up circuit 200 of FIG. 2. In this way, a third circuit 310 and a fourth circuit 320 are formed, for example. In some embodiments, the third circuit 310 comprises the voltage provider 110. In some embodiments, the voltage provider 110 is connected to ground 106. The fourth circuit 320 comprises the charge store 120 and the output driver 130. In some embodiments, the first control switch 144 is closed at the second time, thus connecting the charge store 120 and the output driver 130. Additionally, the output driver 130 is connected to pad 108 and ground 106. In some embodiments, the charge store 120 discharges a stored voltage to the output driver 130. For example, when the first control switch 144 is closed, the stored voltage of the charge store 120 activates the output driver 130 in a manner that does not require a pull up or pull down transistor to bias a gate of a driver transistor for the output driver 130. In other words, the stored voltage of the charge store 120 enables a rapid activation of the output driver 130, thus mitigating a response time associated with the activating the output driver 130. For example, the driver transistor is configured to enter a saturation region quickly, such as within 1 ns, when the stored voltage of the charge store 120 is discharged to the driver transistor.

Figure 4:
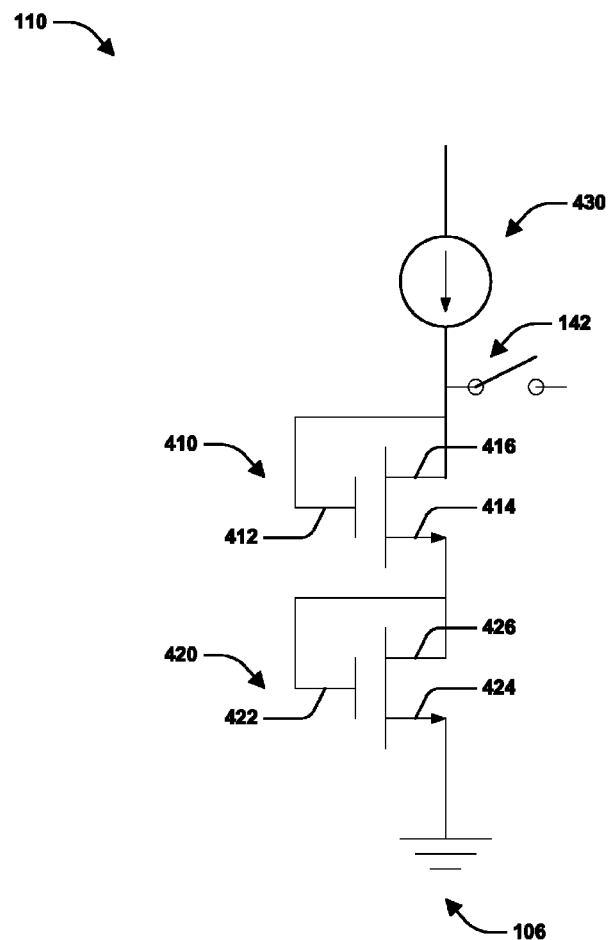
FIG. 4 is a schematic diagram of an example voltage provider of a start-up circuit, according to some embodiments.

FIG. 4 is a schematic diagram of an example voltage provider 110 of a start-up circuit, according to some embodiments. In some embodiments, the voltage provider 110 comprises a first current source 430, a first metal oxide silicon (MOS) transistor 410, a second MOS transistor 420, and a second control switch 142. In some embodiments, the first current source 430 is configured to provide an output drive current. For example, the first current source 430 is connected to the second control switch 142, a first gate 412 of the first MOS transistor 410, and a first drain 416 of the first MOS transistor 410. In some embodiments, a first source 414 of the first MOS transistor 410 is connected to a second gate 422 of the second MOS transistor 420 and a second drain 426 of the second MOS transistor 420. For example, in some embodiments, two or more MOS transistors are cascaded to provide a pre-turn-on voltage. A second source 424 of the second MOS transistor 420 is connected to ground 106. Additionally, the first gate 412 of the first MOS transistor 410 is connected to the first drain 416 of the first MOS transistor 410. In this way, the first MOS transistor 410 comprises a diode configuration. Similarly, the second gate 422 of the second MOS transistor 420 is connected to the second drain 426 of the second MOS transistor 420. In this way, the second MOS transistor 420 comprises a diode configuration. Accordingly, the first MOS transistor 410 or the second MOS transistor is configured to operate as a diode, in some examples. In some embodiments, the pre-turn-on voltage is associated with a turn on voltage for a MOS transistor. For example, the first MOS transistor 410 and the second MOS transistor 420 are associated with respective turn on voltages ($V_{on}$). In some embodiments, the turn on voltage is an operating voltage, for example. For example, if the first MOS transistor 410 has a turn on voltage of $V_{on}$ and the second MOS transistor 420 has a turn on voltage of $V_{on}$, a voltage of $2*V_{on}$ is required to turn on both the first MOS transistor 410 and the second MOS transistor 420. In some embodiments, the first MOS transistor 410 acts as a first diode and the second MOS transistor 420 acts as a second diode, thus enabling current to flow from the first current source 430 when a voltage greater than $2*V_{on}$ is applied, such as at 142. Therefore, the first MOS transistor 410 cascaded with the second MOS transistor 420 provides a pre-turn-on voltage of $2*V_{on}$. Accordingly, at least one of the first MOS transistor 410 or the second MOS transistor 420 is configured to operate at an operating voltage or a turn on voltage (Von) comprising a fraction of the pre-turn-on voltage. For example, when the pre-turn-on voltage is $=2*V_{on}$, the first MOS transistor 410 and the second MOS transistor 420 are associated with an operating voltage or a turn on voltage of $V_{on}$. It will be appreciated that in some embodiments, the pre-turn-on voltage is determined based on a capacitance of the charge store 120, an internal capacitance of an output driver 130, or a parasitic capacitance associated with a driver transistor for the output driver 130. In this way, the pre-turn-on voltage is determined in a precise manner, thus mitigating delays associated with starting the output driver 130 at least because discharging the charge store 120 is substantially unaffected by variations across process, voltage, or temperature (PVT). It will be appreciated that the second control switch 142 is configured to connect the voltage provider 110 to a charge store 120, such as the charge store 120 of FIG. 5 at a first time.

Figure 5:
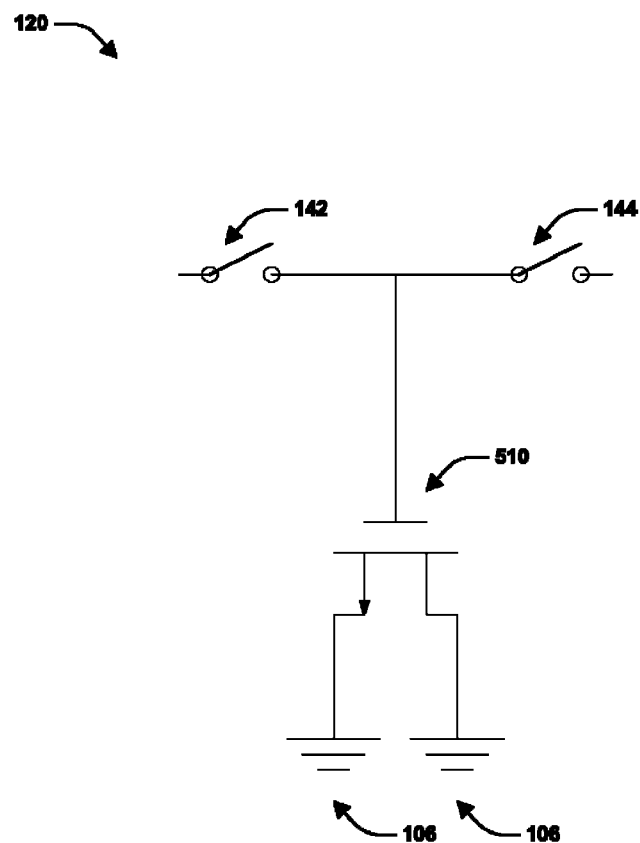
FIG. 5 is a schematic diagram of an example charge store of a start-up circuit, according to some embodiments.

FIG. 5 is a schematic diagram of an example charge store 120 of a start-up circuit, according to some embodiments. In some embodiments, the charge store 120 comprises any capacitance structure configured to store a pre-turn-on charge. For example, charge store 120 comprises a capacitor 510 connected to ground 106. In other embodiments, the capacitor 510 is connected to the first control switch 144 and the second control switch 142. It will be appreciated that the first control switch 144 is configured to connect the charge store to an output driver 130, such as the output driver 130 of FIG. 6 at a second time.

Figure 6:
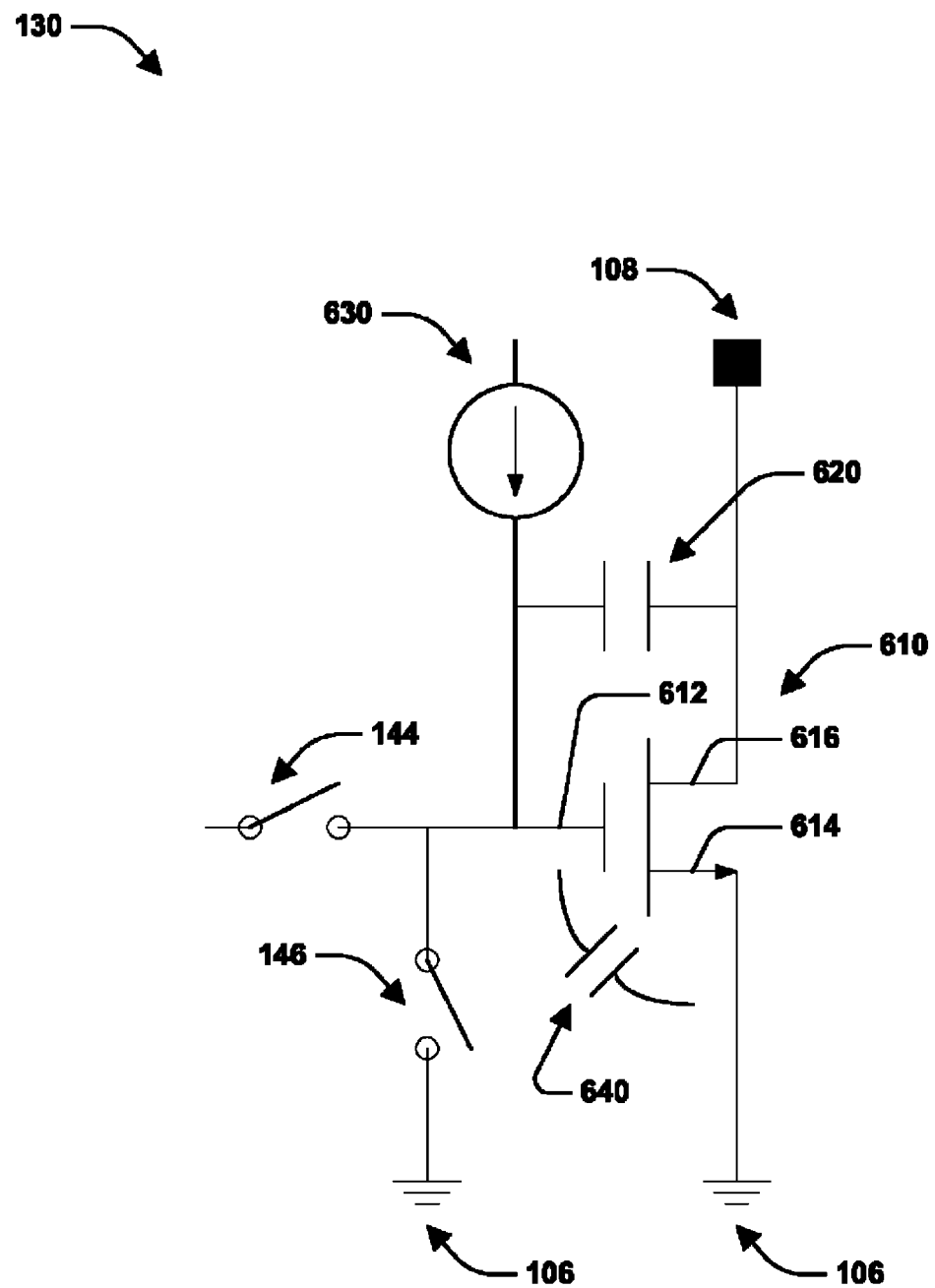
FIG. 6 is a schematic diagram of an example output driver of a start-up circuit, according to some embodiments.

FIG. 6 is a schematic diagram of an example output driver 130 of a start-up circuit, according to some embodiments. In some embodiments, the output driver 130 comprises a second current source 630, an internal capacitance 620 associated with the output driver 130, a third metal oxide semiconductor (MOS) transistor 610, and a parasitic capacitance 640 associated with the third MOS transistor 610. In other embodiments, the output driver comprises at least one of a first control switch 144 or a third control switch 146. For example, the second current source 630 is connected to the internal capacitance 620, a third gate 612 of the third MOS transistor 610, the first control switch 144, and the third control switch 146. The internal capacitance 620 is connected to pad 108 and a third drain 616 of the third MOS transistor 610. In some embodiments, a third source 614 of the third MOS transistor 610 is connected to ground 106. The parasitic capacitance 640 is measured across the third gate 612 and the third source 614 of the third MOS transistor 610, for example. In some embodiments, the third MOS transistor 610 is a driver for the output driver 130 configured to drive current in or out of the output driver 130. That is the third MOS transistor 610 is configured to control a voltage level associated with the pad 108. In some embodiments, the voltage level associated with the pad 108 comprises at least one of a logic high or a logic low. Accordingly, the second control switch 144 and the third control switch 146 respectively control a second connection and a third connection to facilitate operation of the output driver 130. For example, the second control switch 144 is configured to connect the output driver 130 to a charge store 120, such as the charge store of FIG. 1. Additionally, it will be appreciated that the second connection formed by the second control switch 144 enables the charge store 120 to discharge directly to the third gate 612 of the third MOS transistor 610. In this way, the third MOS transistor 610 drives or controls the voltage level associated with the pad 108. The third control switch 146 is configured to connect or disconnect the third gate 612 of the third MOS transistor 610 to ground 106, thus controlling a pull down operation for the third MOS transistor 610 and pad 108. It will be appreciated that in some embodiments, the third MOS transistor 610 is an NMOS transistor configured as a pull down transistor. For example, since the third source 614 of the third MOS transistor 610 is connected to ground 106, the third MOS transistor 610 is turned on or off based on a voltage level at the third gate 612. That is, when a voltage level of the third gate 612 is a logic low, the third MOS transistor 610 is off and the pad 108 is logic high. For another example, when a voltage level of the third gate 612 is a logic high, the third MOS transistor 610 is on and the pad 108 falls from a logic high level to a logic low level, at least because the third MOS transistor 610 is on and configured to pull down the voltage level of the pad 108. In some embodiments, when the third MOS transistor 610 is on, the pad 108 is connected to ground 106, thus pulling the voltage level associated with the pad 108 down to a logic low level, for example.

It will be appreciated that the first control switch 144 and the third control switch 146 are operated based on an inverse relationship to control operation of the output driver 130. That is, when the first control switch 144 is open, the third control switch 146 is closed, and vice versa. In some embodiments, the output driver 130 is configured to close the third control switch 146 to short the third connection and open the first control switch 144 to open the first connection. In other embodiments, the output driver 130 is configured to open the third control switch 146 to open the third connection and close the first control switch 144 to short the first connection. For example, when the third control switch 146 is closed and the first control switch 144 is open, the third gate 612 of the third MOS transistor 610 is connected to ground 106 by the third connection formed by the third control switch 146. Accordingly, a voltage level at the third gate 612 is a logic low at least because of the connection to ground 106 and the third MOS transistor 610 is off, enabling a voltage level of the pad 108 to remain at a logic high level. In some embodiments, the first control switch 144 is open and the third control switch 146 is closed at a first time.

For example, when the third control switch 146 is opened and the first control switch 144 is closed, the third gate 612 is connected to a charge store 120, such as the charge store of FIG. 1. In this way, a third connection is formed by the third control switch 146. Accordingly, when this third connection is formed, a voltage level at the third gate 612 is a logic high at least because of the connection to the charge store 120. In some embodiments, the third gate 612 of the third MOS transistor 610 is disconnected from the ground 106 while the charge store 120 is connected to the output driver 130. Therefore, the charge store 120 discharges a stored voltage, such as a pre-turn-on voltage to the third gate 612 of the third MOS transistor 610, turning the third MOS transistor 610 on in a rapid and immediate fashion, thus mitigating a delay time associated with a change in the voltage level of the pad 108, such as a rising time or a falling time. As mentioned before, when the third MOS transistor 610 is on, a voltage level of the pad 108 is pulled down to a logic low level. In this way, the output driver is activated in a precise and immediate fashion, for example. In some embodiments, the third control switch 146 is opened and the first control switch 144 is closed at a second time. Additionally, it will be appreciated that the second time is after the first time, for example.

Figure 7:
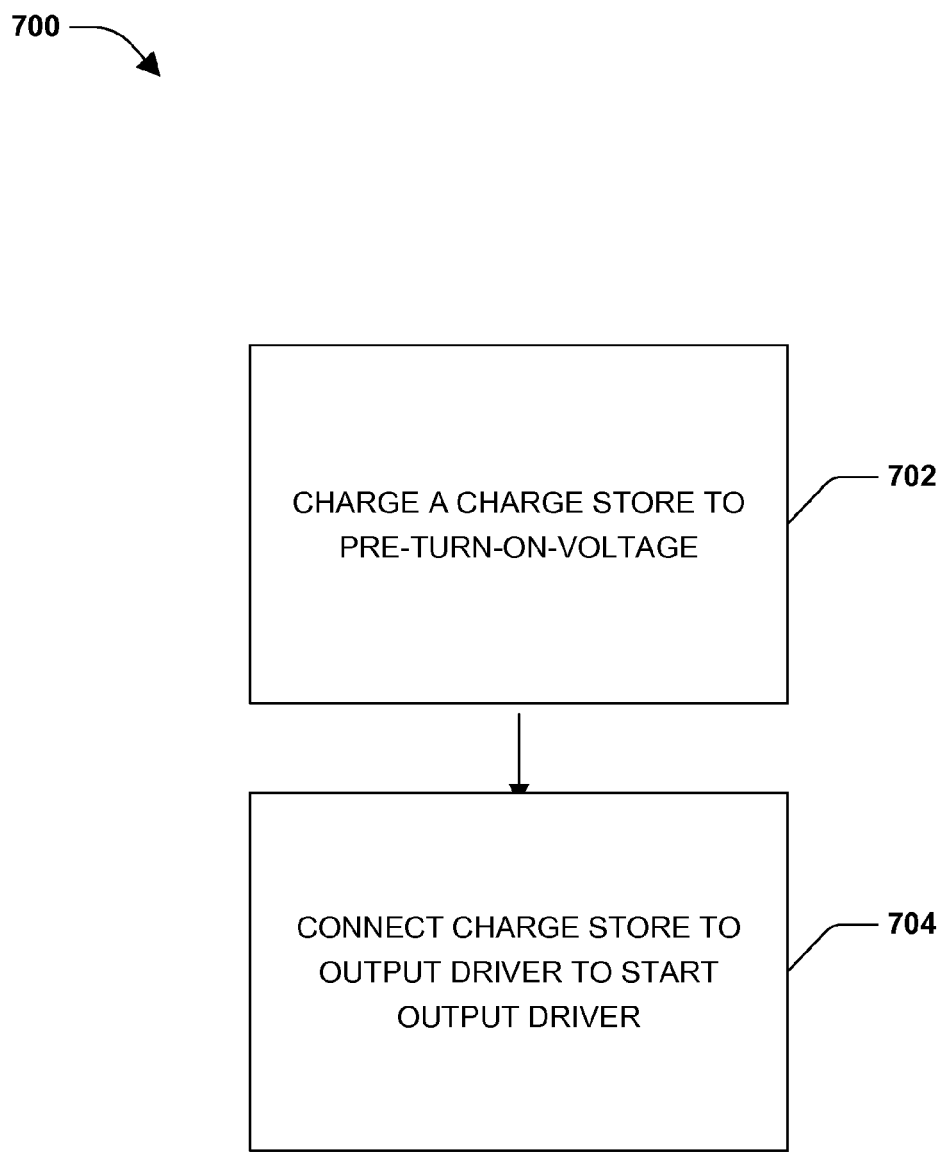
FIG. 7 is a flow diagram of an example method for starting an output driver, according to some embodiments.

FIG. 7 is a flow diagram of an example method 700 for starting an output driver, according to some embodiments. At 702, a charge store is charged to a pre-turn-on voltage. At 704, the charge store is connected to an output driver, thus starting the output driver. In some embodiments, charging the charge store comprises connecting or disconnecting a voltage provider to the charge store. In some embodiments, the charge store is the charge store 120 of FIG. 5. Additionally, the pre-turn-on voltage is based on a turn on voltage or operating voltage ($V_{on}$) associated with a voltage provider, such as the voltage provider 110 of FIG. 4. In some examples, the voltage provider 110 is configured to provide a pre-turn-on voltage of $2*V_{on}$. Accordingly, the charge store, such as charge store 120 stores a charge $Q=C*V$, where C is a capacitance associated with the charge store 120, such as a capacitance of capacitor 510 of FIG. 5. Additionally, V is the voltage stored in the capacitor, and in this example, V=pre-turn-on voltage=$2*V_{on}$. Therefore, the charge in the charge store 120 is $Q=C*V=C*2*V_{on}$.

When the charge store 120 is connected to an output driver, such as output driver 130 of FIG. 6, a voltage of the charge store 120 is discharged to the output driver 130. In some embodiments, the voltage of the charge store 120 is discharged to a third gate 612 of a third MOS transistor 610. For example, the discharged voltage is determined such that the discharged voltage=$Q/C_{output\ driver}$. In this example, Q=the charge in the charge store, or $C*2*V_{on}$. In some embodiments related to FIG. 6, $C_{output\ driver}=C+C_{int}+C_{gs}$. For example, C is the capacitance associated with the charge store 120, $C_{int}$ is an internal capacitance 620 associated with the output driver 130, and $C_{gs}$ is a parasitic capacitance 640 associated with a driving transistor of the output driver 130. In some embodiments, $C=C_{int}+C_{gs}$. Therefore, in these embodiments, the discharged voltage=$V_{on}$. Therefore, in some embodiments, the discharged voltage is different than the pre-turn-on voltage, for example. However, it will be appreciated that the pre-turn-on voltage is based on at least one of a turn on voltage ($V_{on}$) associated with the voltage provider 110, a capacitance of the charge store 120, an internal capacitance 620 of the output driver 130, or a parasitic capacitance 640 of a driving transistor or third MOS transistor 610 of the output driver 130 in other embodiments.

In some embodiments, the method comprises charging the charge store to the pre-turn-on voltage based on a capacitance associated with the third MOS transistor of the output driver. Additionally, the method comprises connecting the charge store to the output driver based on the charge store charged to the pre-turn-on voltage. In other embodiments, the method comprises charging the charge store to the pre-turn-on voltage based on a first current source, such as the first current source 430 of FIG. 4.

Figure 8:
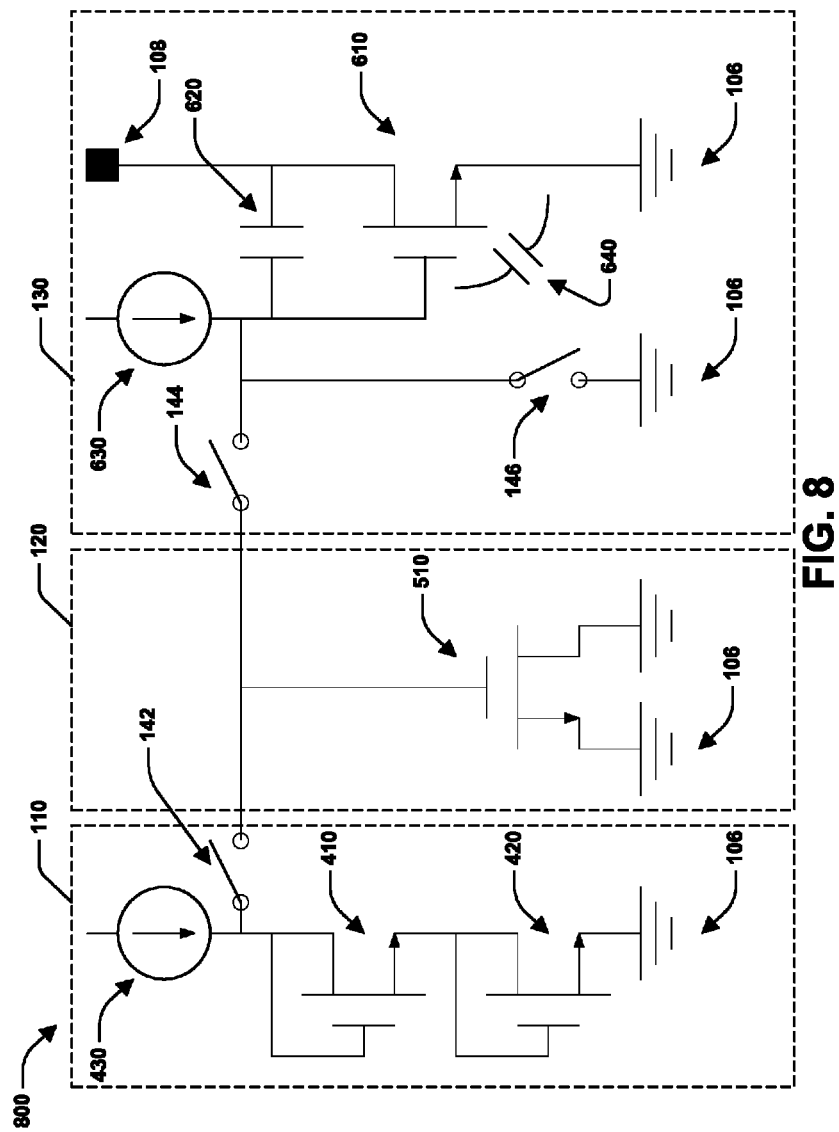
FIG. 8 is a schematic diagram of an example start-up circuit for operating an output driver, according to some embodiments.

FIG. 8 is a schematic diagram of an example start-up circuit 800 for operating an output driver, according to some embodiments. For example, start-up circuit 800 comprises a voltage provider 110, a charge store 120, and an output driver 130. In some embodiments, the voltage provider 110 is the voltage provider 110 of FIG. 4, the charge store 120 is the charge store 120 of FIG. 5, and the output driver 130 is the output driver 130 of FIG. 6. It will be appreciated that in some embodiments, the voltage provider 110 comprises the second control switch 142, while in other embodiments, the charge store 120 comprises the second control switch 142. Additionally, in some embodiments, the output driver 130 comprises the first control switch 144 or the third control switch 146. However, it will be appreciated that in other embodiments, the charge store 120 comprises the first control switch 144 or the third control switch 146. In the start-up circuit 800, the first control switch 144, the second control switch 142, and the third control switch 146 are open. However, it will be appreciated that in some embodiments, such as at a first time, the first control switch 144 is open, the second control switch 142 is closed, and the third control switch 146 is closed. Further, in other embodiments, such as at a second time, the first control switch 144 is closed, the second control switch 142 is open, and the third control switch 146 is open.

Figure 9:
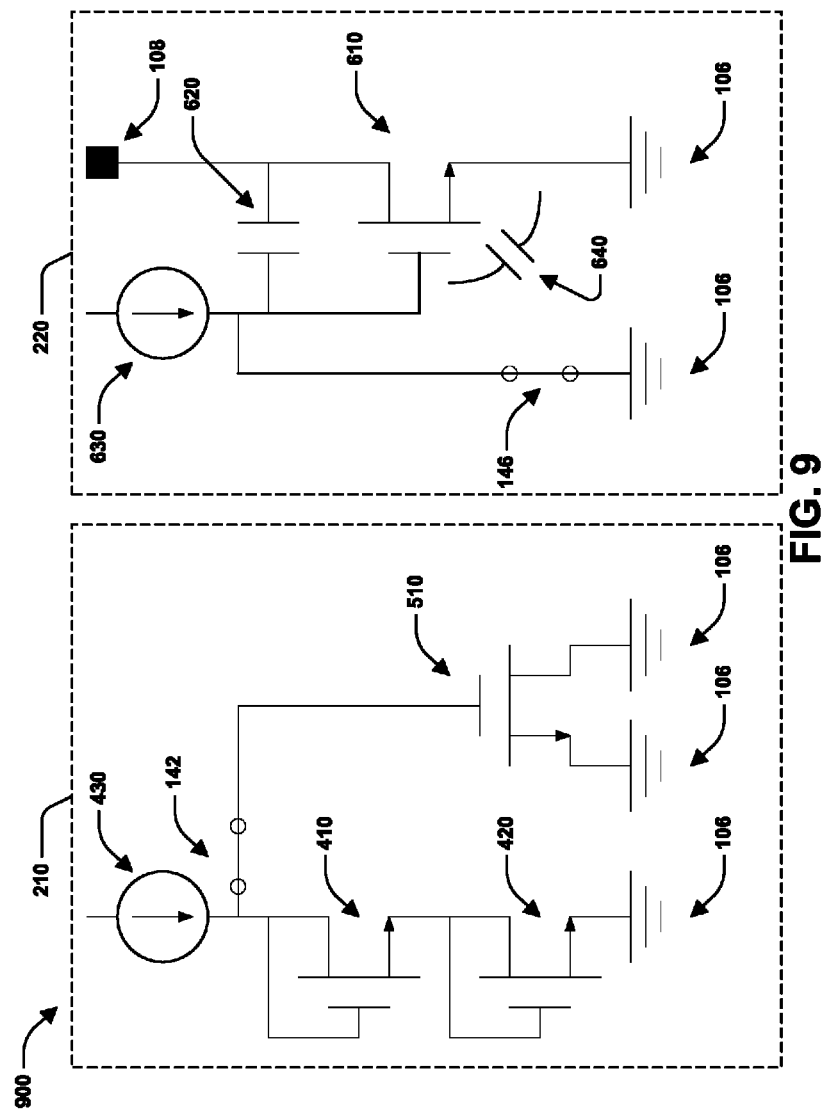
FIG. 9 is a schematic diagram of an example start-up circuit for operating an output driver, according to some embodiments.

FIG. 9 is a schematic diagram of an example start-up circuit 900 for operating an output driver, according to some embodiments. For example, start-up circuit 900 is associated with a first time when the first control switch 144 is open (not shown), the second control switch 142 is closed, and the third control switch 146 is closed. In this way, a first circuit 210 and a second circuit 220 are formed. For example, the first circuit comprises the voltage provider 110 of FIG. 4 connected to the charge store 120 of FIG. 5. It is seen that, the second control switch 142 is closed to form a second connection at 142. The first circuit 210 comprises a first current source 430, a first MOS transistor 410, a second MOS transistor 420, and a capacitor 510. The first MOS transistor 410 and the second MOS transistor 420 are associated with respective turn on or operating voltages ($V_{on}$). Therefore, the first current source is configured to charge the capacitor 510 to a pre-turn-on voltage=$V=2*V_{on}$. The second circuit 220 comprises the output driver 130 of FIG. 6. In some embodiments, the third control switch 146 is connected to ground 106, thus forming a third connection from a third gate of a third MOS transistor 610 to ground 106. When the third gate of a third MOS transistor 610 is connected to ground 106, the third gate is at a logic low voltage level, and the third MOS transistor 610 is off. Therefore, pad 108 remains at a logic high voltage level.

Figure 10:
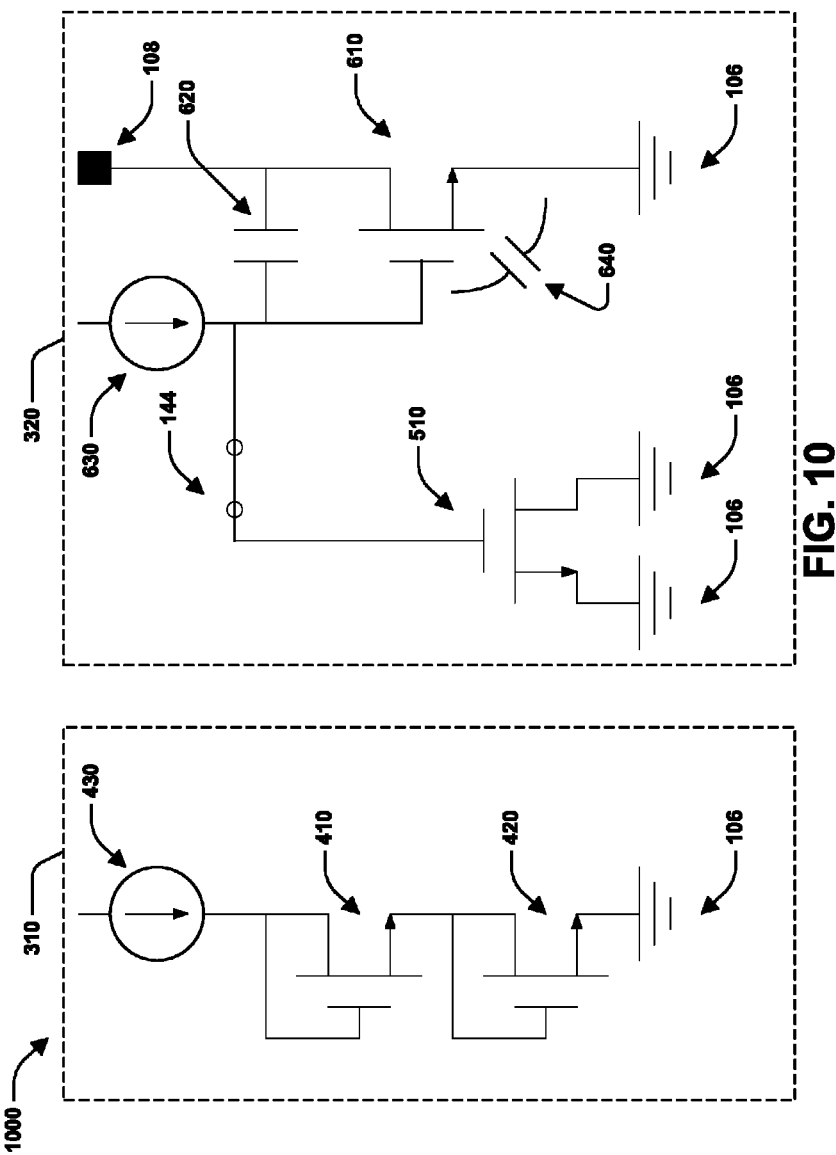
FIG. 10 is a schematic diagram of an example start-up circuit for operating an output driver, according to some embodiments.

FIG. 10 is a schematic diagram of an example start-up circuit 1000 for operating an output driver, according to some embodiments. For example, start-up circuit 1000 is associated with a second time when the first control switch 144 is closed, the second control switch 142 is open (not shown), and the third control switch 146 is open (not shown). In this way, a third circuit 310 and a fourth circuit 320 are formed. For example, the third circuit comprises the voltage provider 110 of FIG. 4. The fourth circuit 320 comprises the charge store 120 of FIG. 5 connected to the output driver 130 of FIG. 6. In some embodiments, the first control switch 144 is closed to form a first connection from the capacitor 510 of the charge store to a third gate of the third MOS transistor 610. When the third gate of the third MOS transistor 610 is connected to the capacitor 510, the third gate is immediately driven to a logic high level at least because the capacitor 510 is configured to discharge a stored voltage, such as a pre-turn-on voltage to the third gate of the third MOS transistor 610. In some embodiments, the stored voltage is the pre-turn-on voltage and the voltage resulting from the discharge is different than the pre-turn-on voltage and is based on at least one of capacitance 510, internal capacitance 620, or parasitic capacitance 640. Therefore, the third MOS transistor 610 is activated quickly and configured to immediately pull down pad 108. When the third gate is at a logic high level, the third MOS transistor 610 is on, thus pulling a voltage level associated with pad 108 down to a logic low level, for example.

According to some aspects, a start-up circuit for operating an output driver is provided, comprising a voltage provider configured to charge a charge store to a pre-turn-on voltage. In some embodiments, the start-up circuit comprises an output driver comprising a first control switch configured to control a first connection between the charge store and the output driver.

According to some aspects, a method for starting an output driver is provided, comprising charging a charge store to a pre-turn-on voltage. In some embodiments, the method comprises connecting the charge store to an output driver to start the output driver.

According to some aspects, a start-up circuit for operating an output driver is provided, comprising a voltage provider configured to charge a charge store to a pre-turn-on voltage based on a second control switch configured to control a second connection between the voltage provider and the charge store. In some embodiments, the start-up circuit comprises an output driver comprising a first control switch configured to control a first connection between the charge store and the output driver and a third control switch configured to control a third connection between a gate of a metal oxide silicon (MOS) driving transistor and a ground.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A start-up circuit, comprising:
   a voltage provider configured to charge a charge store to a pre-turn-on voltage, the voltage provider comprising:
   a first current source configured to provide an output drive current;
   a first metal oxide silicon (MOS) transistor comprising a first gate, a first source, and a first drain, the first gate connected to the first drain and the first current source connected to the first drain;
   a second MOS transistor comprising a second gate, a second source, and a second drain, the second gate connected to the second drain and the second drain connected to the first source; and
   a second control switch configured to control a second connection between the voltage provider and the charge store, the first current source and the first drain connected to the second control switch; and
   an output driver comprising a first control switch configured to control a first connection between the charge store and the output driver.

2. The start-up circuit of claim 1, the charge store comprising at least one of a capacitor, a circuit, or a parasitic capacitance.

3. The start-up circuit of claim 1, the second source connected to ground.

4. The start-up circuit of claim 1, at least one of the first MOS transistor or the second MOS transistor configured to operate at an operating voltage comprising a fraction of the pre-turn-on voltage.

5. The start-up circuit of claim 1, at least one of the first MOS transistor or the second MOS transistor configured to operate as a diode.

6. The start-up circuit of claim 1, the output driver comprising:
   a third MOS transistor comprising a third gate, a third source, and a third drain; and
   a third control switch configured to control a third connection between the third gate and ground, the third control switch connected to the first control switch.

7. The start-up circuit of claim 6, the output driver configured to at least one of:
   close the third control switch to short the third connection and open the first control switch to open the first connection; or
   open the third control switch to open the third connection and close the first control switch to short the first connection.

8. The start-up circuit of claim 6, the output driver comprising a second current source, the second current source connected to the third gate.

9. The start-up circuit of claim 6, the third control switch configured to control the third connection based on logic of the second control switch.

10. The start-up circuit of claim 6, the third drain connected to a pad.

11. A method for starting an output driver, comprising:
   prior to starting the output driver:

charging a charge store to a pre-turn-on voltage; and
connecting a third gate of a third metal oxide silicon (MOS) transistor of the output driver to an element configured to apply a voltage to the third gate that turns off the third MOS transistor; and
connecting the charge store to an output driver to start the output driver.

12. The method of claim 11, charging the charge store comprising connecting a voltage provider to the charge store.

13. The method of claim 11, charging the charge store comprising disconnecting a voltage provider from the charge store.

14. The method of claim 11, connecting the charge store to the output driver comprising applying the pre-turn-on voltage to the third gate.

15. The method of claim 11, connecting the charge store to the output driver comprising disconnecting the third gate from the element, the element comprising ground.

16. The method of claim 11, charging the charge store to the pre-turn-on voltage comprising charging the charge store to the pre-turn-on voltage based on at least one of an operating voltage of a first MOS transistor or an operating voltage of a second MOS transistor.

17. The method of claim 11, charging the charge store to the pre-turn-on voltage comprising charging the charge store to the pre-turn-on voltage based on a capacitance associated with the third MOS transistor.

18. The method of claim 11, connecting the charge store to the output driver comprising connecting the charge store to the output driver based on the charge store charged to the pre-turn-on voltage.

19. The method of claim 11, charging the charge store to the pre-turn-on voltage comprising charging the charge store to the pre-turn-on voltage based on a first current source.

20. A start-up circuit, comprising:
a voltage provider configured to charge a charge store to a pre-turn-on voltage based on a second control switch configured to control a second connection between the voltage provider and the charge store; and
an output driver comprising a first control switch configured to control a first connection between the charge store and the output driver and a third control switch configured to control a third connection between a third gate of a third metal oxide silicon (MOS) transistor and an element configured to apply a voltage to the third gate that turns off the third MOS transistor, the third control switch configured to couple the third gate to the element when the voltage provider is charging the charge store to the pre-turn-on voltage via the second control switch and to decouple the third gate from the element when the charge store is applying the pre-turn-on voltage to the output driver via the first control switch.

* * * * *